United States Patent  (10) Patent No.: US 9,612,276 B2
Yoo et al.  (45) Date of Patent: Apr. 4, 2017

(54) TEST DEVICE AND TEST SYSTEM INCLUDING THE SAME

(71) Applicant: Samsung Electronics Co., Ltd., Suwon-si (KR)

(72) Inventors: Jong-Woon Yoo, Gwangmyeong-si (KR); Sang-Kyeong Han, Daejeon (KR); Ung-Jin Jang, Asan-si (KR); Ki-Jae Song, Goyang-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 407 days.

(21) Appl. No.: 14/299,058

(22) Filed: Jun. 9, 2014

(65) Prior Publication Data

US 2015/0054532 A1 Feb. 26, 2015

(30) Foreign Application Priority Data

Aug. 21, 2013 (KR) ........................ 10-2013-0099169

(51) Int. Cl.
*G01R 31/10* (2006.01)
*G01R 31/28* (2006.01)

(52) U.S. Cl.
CPC ................................ *G01R 31/2879* (2013.01)

(58) Field of Classification Search
CPC ........... G01N 27/4163; G01N 33/0027; G01R 31/307; G01R 31/31715; G01R 31/2853; H01L 22/32
USPC .... 324/750.01, 500, 750.15–750.18, 756.02, 324/750.3, 754.01, 522, 713, 600, 76.11
See application file for complete search history.

(56) References Cited

U.S. PATENT DOCUMENTS

| 4,282,292 | A | 8/1981 | Stewart |
| 5,278,841 | A | 1/1994 | Myers |
| 6,098,027 | A | 8/2000 | Yang |
| 6,192,496 | B1 | 2/2001 | Lawrence et al. |
| 6,268,717 | B1 | 7/2001 | Jarvis et al. |
| 6,294,921 | B1 | 9/2001 | Bonaccio et al. |
| 6,714,038 | B2 | 3/2004 | Lee et al. |
| 6,859,058 | B2 | 2/2005 | Manhaeve et al. |
| 7,152,012 | B2 | 12/2006 | Gearhardt |
| 2003/0102568 | A1* | 6/2003 | Tomishima ...... G01R 31/31723 257/777 |
| 2010/0123509 | A1* | 5/2010 | Lin ..................... H01L 27/0266 327/436 |
| 2010/0237877 | A1 | 9/2010 | Hsu |

FOREIGN PATENT DOCUMENTS

| JP | 2004-012297 | 1/2004 |
| JP | 2011-053065 | 3/2011 |
| JP | 2012-229971 | 11/2012 |
| KR | 10-2010-0049755 A | 5/2010 |
| KR | 10-0988610 B1 | 10/2010 |

* cited by examiner

*Primary Examiner* — Melissa Koval
*Assistant Examiner* — Trung Nguyen
(74) *Attorney, Agent, or Firm* — Muir Patent Law, PLLC

(57) ABSTRACT

A test device includes a test unit and a voltage selection circuit. The test unit is configured to detect a voltage at a test pad of a semiconductor device under test by applying a test current to the test pad. The voltage selection circuit is configured to apply a selection voltage to a ground pad of the semiconductor device under test by selecting one of a plurality of voltages according to a test mode.

19 Claims, 13 Drawing Sheets

400

| TEST RESULT | | INTERFACE CHIP ESD DIODE | |
|---|---|---|---|
| | | CONNECTED | NOT CONNECTED |
| DUT ESD DIODE | CONNECTED | VDD−VD | VDD−VD |
| | NOT CONNECTED | −VD | −∞ |

TEST DEVICE AND TEST SYSTEM INCLUDING THE SAME

CROSS-REFERENCE TO RELATED APPLICATION

This application claims priority under 35 USC §119 to Korean Patent Application No. 10-2013-0099169, filed on Aug. 21, 2013, in the Korean Intellectual Property Office (KIPO), the contents of which are herein incorporated by reference in their entirety.

BACKGROUND

1. Technical Field

Example embodiments relate generally to testing of semiconductor device and more particularly to a test device and a test system including the test device.

2. Description of the Related Art

In general, a high quality test is essential to produce a high quality semiconductor device such as a semiconductor chip. The test of the semiconductor device may include several processes. A DC test is included in the test processes to test a connection of an external pad of the semiconductor device by applying a current or voltage to the external pad of the semiconductor device.

In a case where a DC test is carried out by applying the current or voltage to the external pad of the semiconductor device, when a circuit of the semiconductor device connected to the external pad is broken, the test of the semiconductor device may not be carried out properly.

SUMMARY

Some example embodiments provide a test device capable of preventing a circuit destruction during a test process of a semiconductor device.

Some example embodiments provide a test system capable of preventing the circuit destruction during the test process of the semiconductor device.

According to example embodiments, a test device includes a test unit and a voltage selection circuit. The test unit is configured to detect a voltage at a test pad of a semiconductor device under test by applying a test current to the test pad. The voltage selection circuit is configured to apply a selection voltage to a ground pad of the semiconductor device under test. The selection voltage is one of a plurality of voltages according to a test mode.

The selection voltage is a first voltage having a first voltage level and a connectivity of the test pad is normal, the detected voltage at the test pad has a second voltage level less than the first voltage level.

The test unit may include a control unit configured to provide the test current in an open/short test mode and a test interface chip configured to apply the test current to the test pad bypassing the test current through a test switch that is turned on in the open/short test mode.

The voltage selection circuit may include a selection voltage switch configured to select either a ground voltage or a first voltage having a first voltage level greater than the ground voltage in response to a control signal that is activated in the open/short test mode.

The voltage selection circuit may be located inside the test interface chip, and wherein the selection voltage switch receives the control signal from a controller included in the test interface chip.

The voltage selection circuit may be located outside the test interface chip, and wherein the selection voltage switch receives the control signal from the control unit.

The selection voltage switch may be configured to select the first voltage as the selection voltage in the open/short test mode, and select the ground voltage as the selection voltage in a test mode other than the open/short test mode.

The voltage selection circuit may be located outside the test interface chip, and the voltage selection circuit may receive the first voltage from the control unit.

According to example embodiments, a test system includes a semiconductor device under test, a test unit, and a voltage selection circuit. The semiconductor device under test includes a test pad and a ground voltage pad. The semiconductor device under test is connected to provide a test response voltage based on a test current and a selection voltage. The test unit is connected to detect a test response voltage at the test pad of the semiconductor device under test by applying the test current to the test pad. The voltage selection circuit is connected to apply the selection voltage to the ground voltage pad. The selection voltage is one of a plurality of voltages according to a test mode.

The semiconductor device under test may include a first diode including a cathode connected to a power supply voltage and an anode connected to the test pad and a second diode including a cathode connected to the test pad and an anode connected to the ground voltage pad. In open/short test mode, the test current may be additionally provided to the test pad through the second diode.

The power supply voltage is higher than a turn-on voltage of the second diode.

The semiconductor device is configured such that a connectivity of the second diode may be tested based on the test response voltage in the open/short test mode.

The semiconductor device is configured such that the second diode may be determined to be connected when the test response voltage corresponds to the difference value between the power supply voltage and the turn-on voltage of the second diode.

The semiconductor device is configured such that the second diode may be determined to be not connected when the absolute value of the test response voltage corresponds to the turn-on voltage of the second diode.

The semiconductor device is configured such that the connectivity of the second diode and a connectivity of a diode of an interface chip of the test unit may be determined to be not connected when the test response voltage is negatively infinite, the interface chip being connected to the test pad.

According to example embodiments, a method of testing a semiconductor device is provided. The method includes preparing a test equipment and the semiconductor device under test; connecting the test equipment to a test pad and a ground pad of the semiconductor device; applying a first voltage to the ground pad when the semiconductor device is in an open/short test mode, the first voltage having a voltage level greater than a ground level; and measuring a voltage at the test pad and determining whether a connectivity of the test pad is normal or abnormal.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Figure 1:
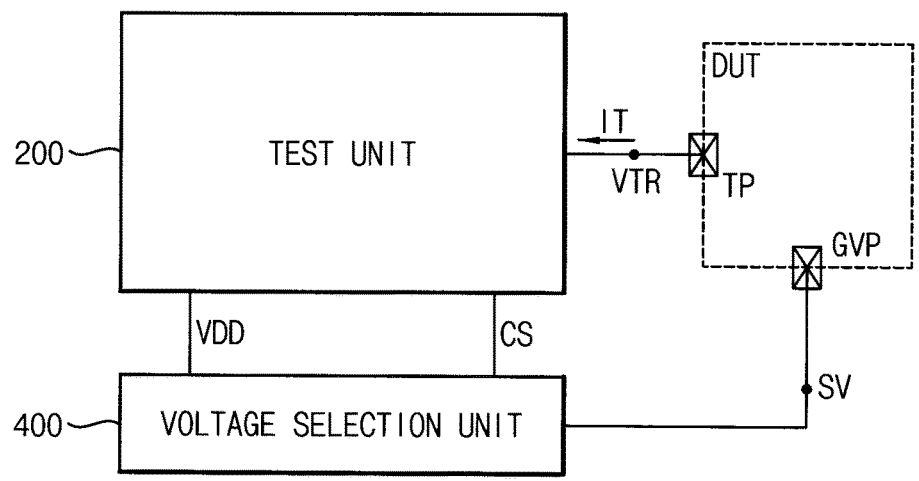
FIG. 1 is a block diagram illustrating a test device according to example embodiments.

Various example embodiments will be described more fully hereinafter with reference to the accompanying drawings, in which some example embodiments are shown. The present disclosure may, however, be embodied in many different forms and should not be construed as limited to the example embodiments set forth herein. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. Unless indicated otherwise, these terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present disclosure. As used herein, the singular forms "a," "an" and "the" are intended to include the plural forms as well, unless the context clearly indicates otherwise. It will be further understood that the terms such as "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a test device according to example embodiments.

Referring to FIG. 1, a test device (or a test equipment) 10 may include a test unit 200 and a voltage selection circuit 400.

The test unit 200 detects a test response voltage VTR by applying a test current IT to a test pad TP of a device under test DUT and performs a DC test (e.g., an open/short test) of the device under test DUT based on the test response voltage VTR. For example, the device under test may be one of a semiconductor chip (e.g., a semiconductor wafer chip), a semiconductor package, etc. The test unit may include circuitry for performing the testing described herein, and may include additional components, for example, a power supply, a current source, a voltage meter, switches, diodes, etc.

A connectivity of the test pad TP inside the device under test DUT may be tested variously.

In one embodiment, the test response voltage VTR may be measured by applying a test current IT to the device under test DUT. When the test response voltage VTR is analyzed, the connectivity inside the device under test DUT may be tested.

For example, if a normal response voltage NRV is known, which is expected to be measured in a normal connectivity condition by applying the test current IT to the test pad TP, the connectivity of the test pad TP inside the device under test DUT may be tested using the normal response voltage NRV. If the test response voltage VTR is substantially equal to the normal response voltage NRV, the connectivity of the test pad TP inside the device under test DUT may be determined to be normal. The term "normal" may refer to a state in which a connectivity of the test pad of the device is not broken, for example, a diode connected between the test pad and a ground voltage pad of the device is not broken. If the test response voltage VTR is not equal to the normal response voltage NRV, the connectivity inside the device under test DUT may be determined to be abnormal. The term "abnormal" may refer to a state in which a connectivity of the test pad of the device is broken, for example, the diode connected between the test pad and the ground voltage pad of the device is broken.

In one embodiment, the test response current ITR may be measured by applying a test voltage VT to the device under test DUT. If the test response current ITR is analyzed, the connectivity inside the device under test DUT may be tested.

For example, if a normal response current NRC is known, which is expected to be measured by applying the test voltage VT to the test pad TP, the connectivity inside the device under test DUT may be tested using the normal response current NRC. If the test response current ITR is substantially equal to the normal response current NRC, the connectivity inside the device under test DUT may be determined to be normal. If the test response current ITR is not equal to the normal response current NRC, the connectivity inside the device under test DUT may be determined to be abnormal.

The present disclosure is described with exemplary embodiments of measuring the test response voltage VTR by applying the test current IT to the device under test DUT. However, principles of the present disclosure may be applied to exemplary embodiments of measuring the test response current ITR by applying the test voltage VT to the device under test DUT.

For example, a direction of the test current IT may be from the test unit 200 toward the device under test DUT as illustrated in FIG. 1. However the test current IT may flow from the device under test DUT toward the test unit 200.

The voltage selection circuit 400 applies a selection voltage SV to a ground voltage pad GVP of the device under test DUT by selecting one of a plurality of voltages according to a test mode.

The selection voltage SV may be applied to the ground voltage pad GVP so that the test response voltage VTR has a positive voltage level.

Test modes of the device (e.g., a semiconductor chip, a semiconductor package, etc.) are various. For example, in operation test mode, whether the circuit inside the device is operated normally or abnormally may be tested. For example, in a DC test mode, the connectivity of power-supply wiring inside the device may be tested.

In one embodiment, the selection voltage SV is applied to the ground voltage pad GVP by selecting one of a plurality of voltages according to the test mode. For example, in case of applying a ground voltage VSS to the ground voltage pad GVP in the DC test mode (e.g., an open/short test mode), if the direction of the test current IT is from the device under test DUT toward the test unit 200, the test response voltage VTR measured in the test pad TP may be a negative voltage level. As will be described with reference to FIG. 3, if the test response voltage VTR is a negative voltage level, a circuit of the device that is connected to the test pad TP may be broken.

In case of applying a power supply voltage VDD to the ground voltage pad GVP in the DC test mode (e.g., an open/short test mode), if the direction of the test current IT is from the device under test DUT toward the test unit 200, the test response voltage VTR measured in the test pad TP may be a positive voltage level. If the test response voltage VTR is a positive voltage level, the circuit inside the device may not be broken.

The circuit destruction may be prevented if the selection voltage SV is selected so that the test response voltage VTR of the test pad TP in the DC test mode does not have the negative voltage level.

The plurality of voltages may include more than two voltage values including the ground voltage VSS. The plurality of voltages except the ground voltage VSS may be the voltages in which the circuit destruction does not occur.

The ground voltage pad GVP may be a pad to test the device under test DUT during the open/short test mode, and the ground voltage pad GVP may be connected to the ground voltage VSS after the open/short test.

Figure 2:
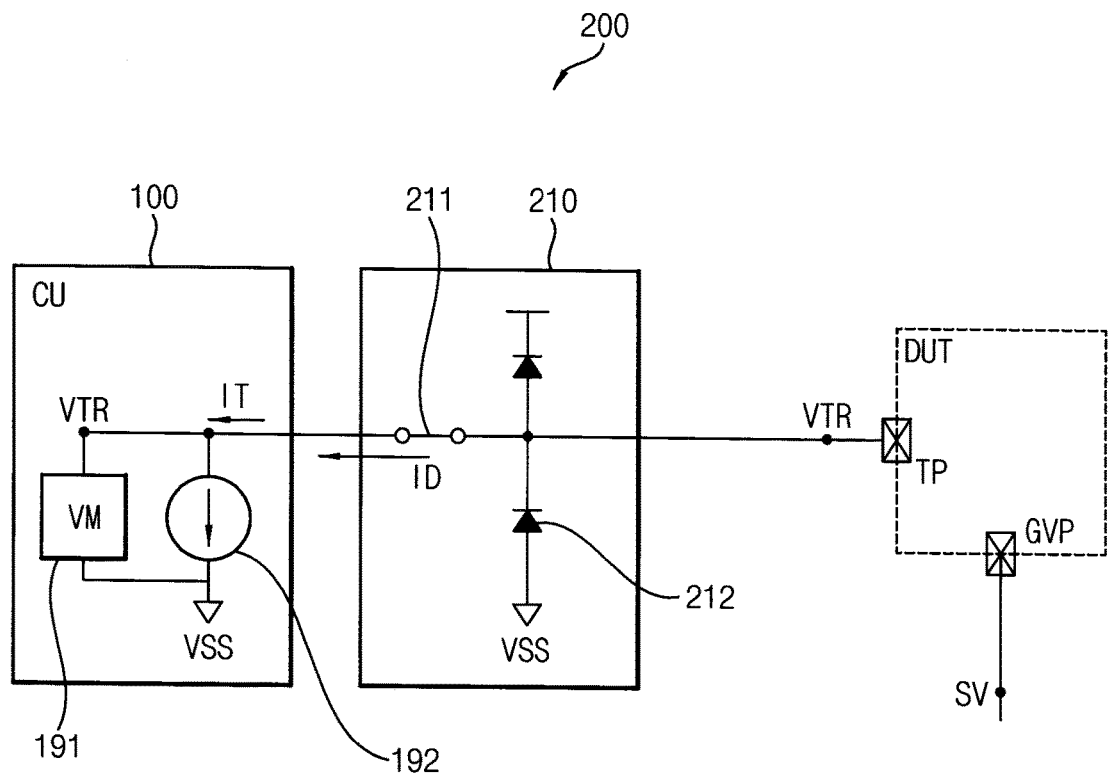
FIG. 2 is a circuit diagram illustrating an example of a test unit included in the test device of FIG. 1.
Figure 3:
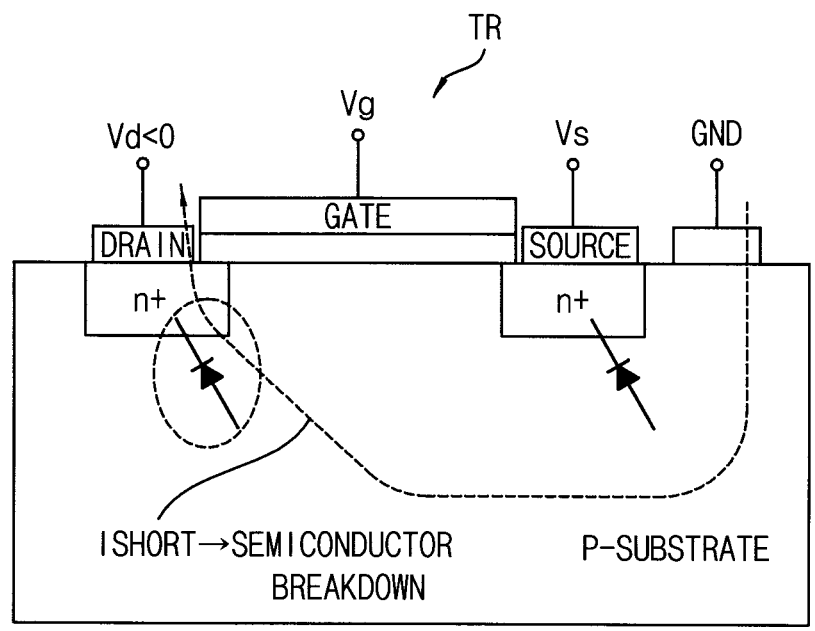
FIG. 3 is a diagram for describing an operation of the test unit of FIG. 2.

FIG. 2 is a circuit diagram illustrating an example of a test unit included in the test device of FIG. 1 and FIG. 3 is a diagram for describing an operation of the test unit of FIG. 2.

Referring to FIG. 2, the test unit 200 may include a control unit 100 and a test interface chip 210.

The control unit 100 may provide the test current IT in the DC test mode.

The control unit 100 may be an automatic test equipment ATE. The automatic test equipment ATE may include a current source 192 and a voltage tester 191. The current source 192 may provide the test current IT for the test interface chip 210 in the DC test mode. The voltage tester 191 may measure the test response voltage VTR at the test pad TP of the device under test DUT.

Alternatively, the automatic test equipment ATE may include a voltage source and a current tester. The voltage source may provide the test voltage VT for the test interface chip 210 in the DC test mode. The current tester may measure the test response current ITR at the test pad TP of the device under test DUT.

The test interface chip 210 may apply the test current IT to the test pad TP bypassing the test current IT through a test switch 211 that is turned on in the DC test mode.

The test interface chip 210 may connect the control unit 100 and the device under test DUT. If the operation speed of the control unit 100 is slow, it is not easy to test the device under test DUT having a high operation speed. The test interface chip 210 may be used to overcome the speed difference between the control unit 100 and the device under test DUT.

The test interface chip 210 may turn-on a test switch 211 in the DC test mode. If the test switch 211 is turned-on, the test current IT generated from the control unit 100 may be transferred to the device under test DUT through the test switch 211.

Referring to FIG. 2 and FIG. 3, the test switch 211 is implemented using the transistor TR.

The direction of the test current IT is shown from the test unit 200 toward the device under test DUT. However, the test current IT may flow according to the direction from the device under test DUT toward the test unit 200.

A source of the transistor TR may be connected to the test pad TP. In case the transistor TR is turned-on, the test current IT may be transferred to a drain of the transistor TR through the source of the transistor TR. As will be described with reference to FIG. 7, the test current IT in the DC test mode may be transferred from the ground voltage pad GVP of the device under test DUT to the test pad TP through a diode 233. Therefore the test current IT transferred to the test pad TP may be transferred to the control unit 100 through the test switch 211.

In case the ground voltage VSS is applied to the ground voltage pad GVP as the selection voltage SV, a voltage drop at the test pad TP may occur because of the second diode 233 placed between the ground voltage pad GVP and the test pad TP.

Therefore the voltage at the test pad TP is lower voltage than the voltage at the ground voltage pad GVP. For example, the voltage at test pad TP may be a negative voltage level if the ground voltage VSS is applied to the ground voltage pad GVP.

Referring to FIG. 3, when a gate voltage of the transistor TR is a logic high, the transistor TR may be turned-on and the source voltage of the transistor TR is substantially equal to the drain voltage of the transistor TR.

In case the voltage at test pad TP is the negative voltage level, the drain voltage of the transistor TR may be the negative voltage level if the transistor TR is turned-on in the DC test mode. If the drain voltage of the transistor TR is the negative voltage level, the transistor TR may be broken.

Referring to FIG. 3, a diode may be modeled between the drain of the transistor TR and the ground voltage VSS. In case the drain voltage of the transistor TR is higher than the ground voltage VSS, if the transistor TR is turned-on, the current may flow forming the channel between the source and the drain of the transistor TR. However, In case the drain voltage of the transistor TR is lower than the ground voltage VSS, the diode between the drain of the transistor TR and the ground voltage VSS may be turned-on and the transistor TR may operate abnormally because the short circuit path can be formed between the drain of the transistor TR and the ground voltage VSS.

Using the test device 10 according to the example embodiments, the circuit destruction (e.g., transistor TR destruction) may be prevented if the selection voltage SV is selected so that the test response voltage VTR in the DC test mode does not have a negative voltage level.

Figure 4:
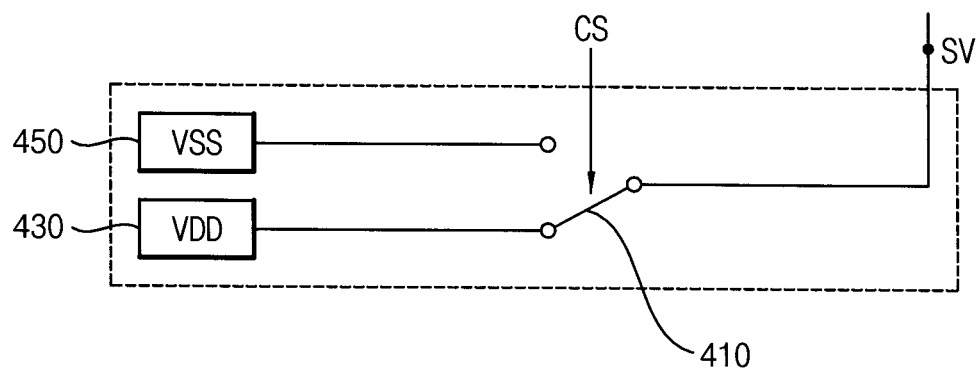
FIG. 4 is a circuit diagram illustrating an example of a voltage selection circuit included in the test device of FIG. 1.

FIG. 4 is a circuit diagram illustrating an example of a voltage selection circuit included in the test device of FIG. 1.

Referring to FIG. 4, the voltage selection circuit 400 may include a selection voltage switch 410. The selection switch 410 may select the selection voltage SV between a ground voltage VSS and power supply voltage VDD in response to a control signal that is activated in the DC test mode.

The plurality of voltages may be more than two voltage values including the ground voltage VSS. The plurality of voltages except the ground voltage VSS may be the voltages in which the circuit destruction does not occur.

A control signal CS may be used as a signal controlling the selection voltage SV switch. The control signal CS in the DC test mode may select the voltage except the ground voltage VSS. If the plurality of voltages is only the ground voltage VSS and power supply voltage VDD, the control signal CS may be implemented with 1 bit (e.g., logic 0 or logic 1).

Figure 5:
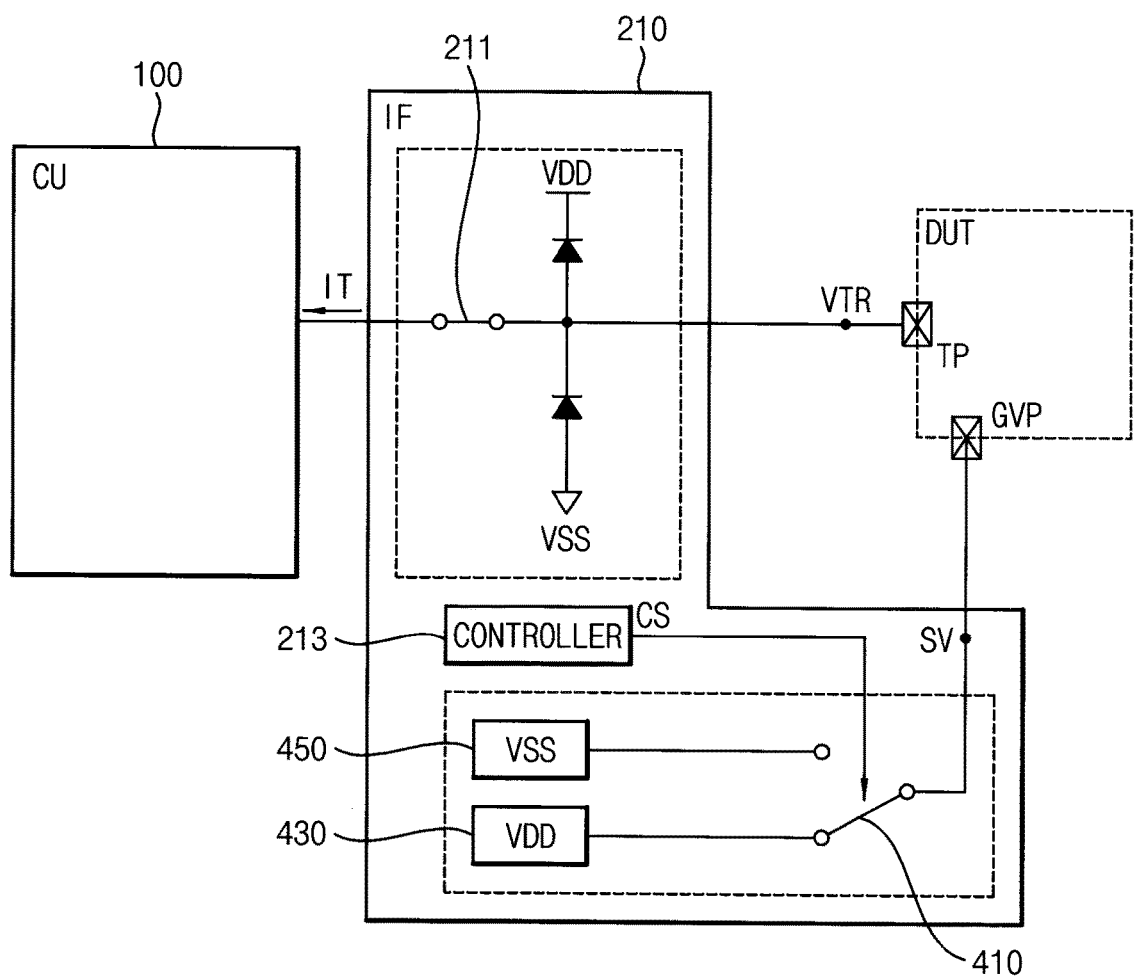
FIG. 5 is a circuit diagram illustrating an example of the test device of FIG. 1.

FIG. 5 is a circuit diagram illustrating an example of the test device of FIG. 1.

Referring to FIG. 5, in one embodiment, the voltage selection circuit 400 may be implemented inside the test interface chip 210. The selection voltage SV switch may receive the control signal CS from a controller 213 in the test interface chip 210.

The test interface chip 210 may be implemented in a field programmable gate array FPGA. The controller circuit controlling the selection voltage SV switch may be implemented using FPGA.

The controller 213 of the test interface chip 210 in the DC test mode may provide the control signal CS for the selection voltage SV switch to select the power supply voltage VDD as the selection voltage SV.

If the power supply voltage VDD is selected as the selection voltage SV, the power supply voltage VDD may be applied to the ground voltage pad GVP. As will be described with reference to FIG. 7, though the voltage drop may occur because of the second diode 233 placed between the ground voltage pad GVP and the test pad TP, the test response voltage VTR may be a positive voltage level. Therefore the circuit destruction may be prevented.

In case the voltage selection circuit 400 is implemented inside the test interface chip 210, the power supply voltage VDD used in the voltage selection circuit 400 may be supplied from the test interface chip 210.

Figure 6:
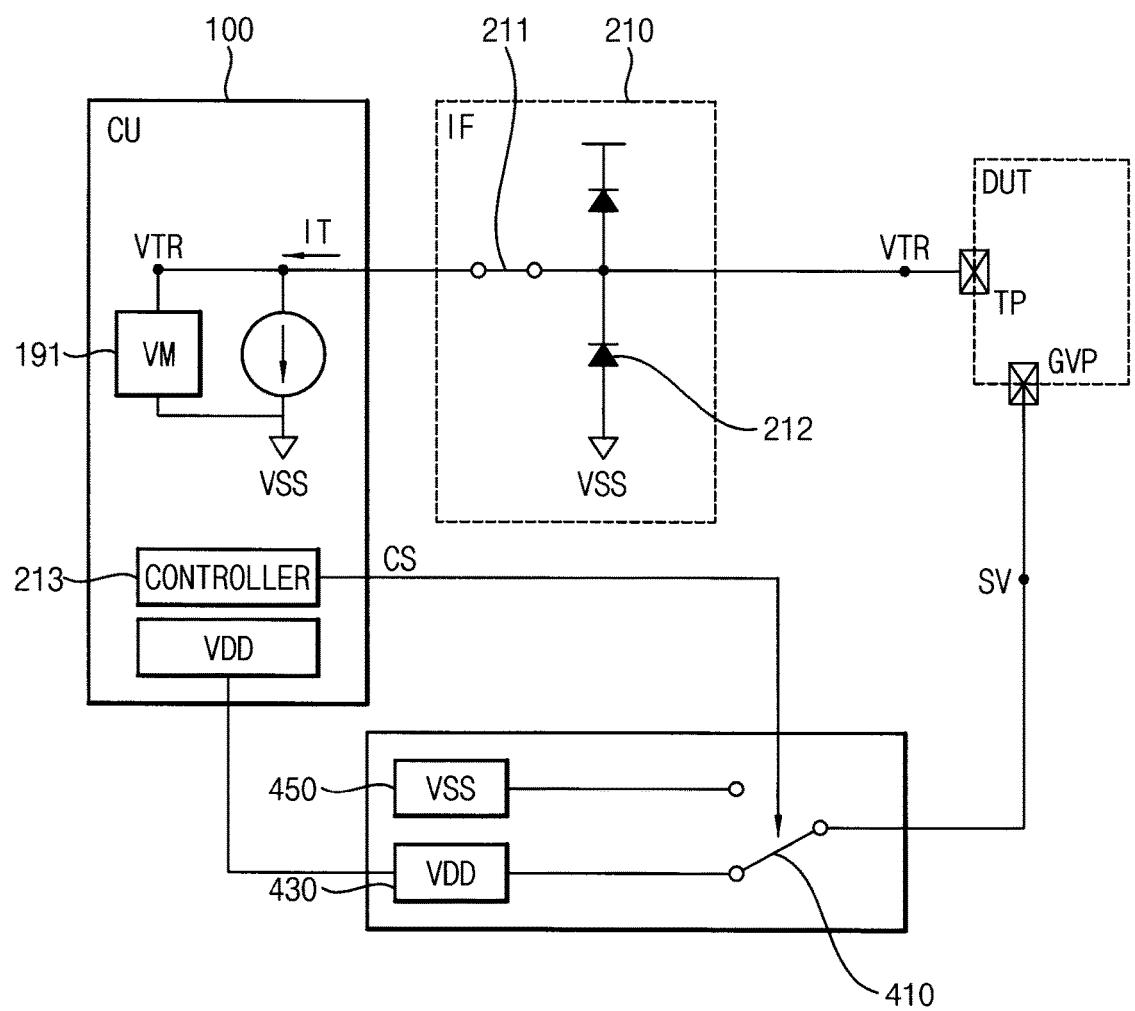
FIG. 6 is a circuit diagram illustrating other example of the test device of FIG. 1.

FIG. 6 is a circuit diagram illustrating other example of the test device of FIG. 1.

Referring to FIG. 6, the voltage selection circuit 400 may be implemented outside the test interface chip 210 and the selection voltage switch 410 may receive the control signal CS from the control unit 100.

The controller 213 in the control unit 100 may provide the control signal CS in the DC test mode so that the selection voltage switch 410 selects the power supply voltage VDD as the selection voltage SV. If the power supply voltage VDD is selected as the selection voltage SV, the power supply voltage VDD may be applied to the ground voltage pad GVP. Though the voltage drop may be occurred because of the second diode 233 placed between the ground voltage pad GVP and the test pad TP, the test response voltage VTR may be a positive voltage level. Therefore the circuit destruction may be prevented In case the voltage selection circuit 400 is implemented outside the test interface chip 210, the voltage selection circuit may receive the power supply voltage VDD from the control unit 100. The control unit 100 may include a control circuit or control circuitry for implementing described herein.

In example embodiments, the selection voltage switch 410 in the DC test mode may apply the power supply voltage VDD as the selection voltage SV to the ground voltage pad GVP.

In example embodiments, the selection voltage switch 410 in the operation test mode (e.g., in a test mode other than the open/short test) may apply the ground voltage VSS as the selection voltage SV to the ground voltage pad GVP.

After the open/short test, a case wherein the voltage of the test pad TP is a negative voltage level may not occur any more. Therefore in the operation test mode (e.g., other than the open/short test mode), the operation of the device under test DUT may be tested using selecting the ground voltage VSS as the selection voltage SV.

Using the test device 10 according to the example embodiments, the circuit destruction may be prevented if the selection voltage SV is selected so that the test response voltage VTR in the DC test mode does not have the negative voltage level.

Figures 7, 8:
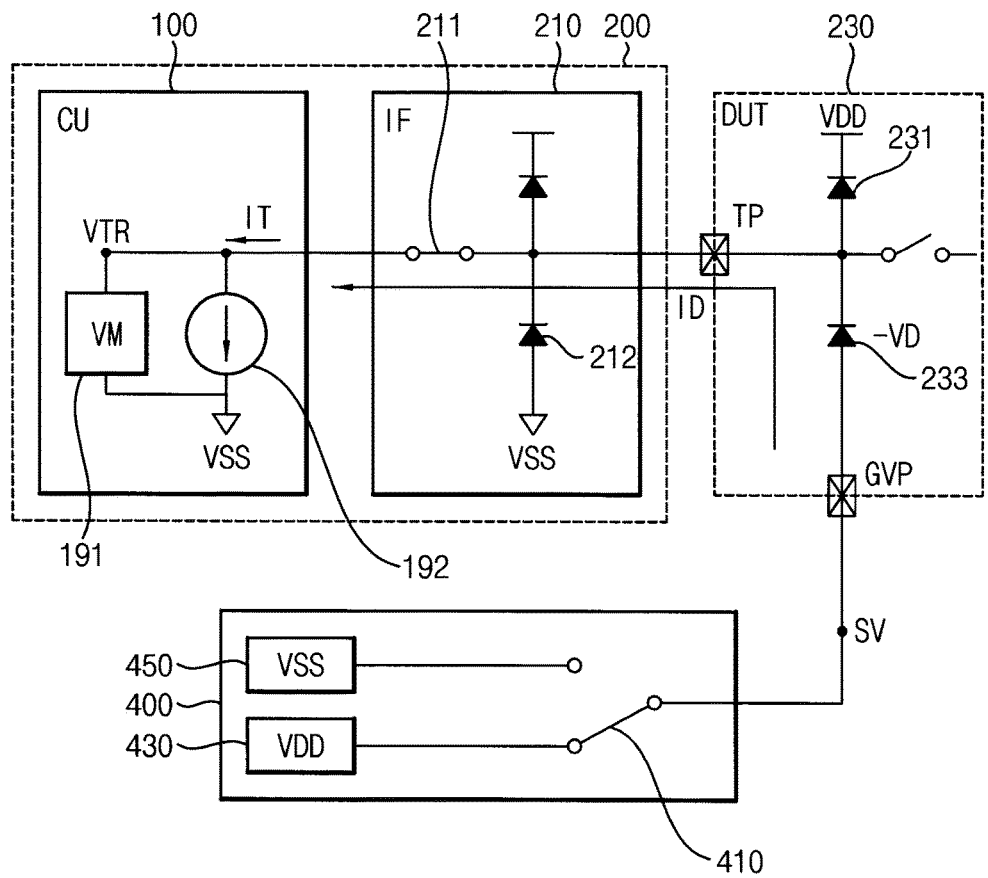
FIG. 7 is a circuit diagram illustrating a test system according to example embodiments.
FIG. 8 is a diagram illustrating test results of the test system of FIG. 7 according to the connectivity of each diode included in the device under test and a test interface chip.

FIG. 7 is a circuit diagram illustrating a test system according to example embodiments.

Referring to FIG. 7, the test system may include the test unit 200, the voltage selection circuit 400 and the device under test DUT. For example, the device under test DUT may be one of a semiconductor chip, a semiconductor package, etc.

The test unit 200 may detect a test response voltage VTR by applying a test current IT to a test pad TP of the device under test DUT and perform a DC test (e.g., an open/short test) based on the test response voltage VTR.

In one embodiment, the test response voltage VTR can be measured by applying the test current IT to the device under test DUT. When the test response voltage VTR is analyzed, a connectivity of the test pad TP inside the device under test DUT is tested.

For example, if a normal response voltage NRV is known, which is expected to be measured in normal connectivity condition by applying the test current IT to the test pad TP, the connectivity inside the device under test DUT may be tested using the normal response voltage NRV. If the test response voltage VTR is substantially equal to the normal response voltage NRV, the connectivity inside the device under test DUT may be determined to be normal. The term "normal" may be used to refer to a state in which a connectivity of the test pad of the device is not broken, for example, a diode connected between the test pad and a ground voltage pad of the device is not broken. If the test response voltage VTR is not equal to the normal response voltage NRV, the connectivity inside the device under test DUT may be determined to be abnormal. The term "abnormal" may be used to refer to a state in which the connectivity of the test pad of the device is broken, for example, the diode connected between the test pad and the ground voltage pad of the device is broken.

The voltage selection circuit 400 may apply a selection voltage SV to a ground voltage pad GVP of the device under test DUT by selecting one of a plurality of voltages according to a test mode.

The selection voltage SV may be applied to the ground voltage pad GVP by selecting one of a plurality of voltages according to the test mode. For example, in case of applying a ground voltage VSS to the ground voltage pad GVP in the DC test mode, if the direction of the test current IT is from the device under test DUT toward the test unit 200, the test response voltage VTR measured at the test pad TP may be a negative voltage level. If the test response voltage VTR is a negative voltage level, a circuit of the interface chip 210 that is connected to the test pad TP may be broken. Thus, the negative voltage level may indicate a broken circuit.

The plurality of voltages may include more than two voltage values including the ground voltage VSS. The plurality of voltages except the ground voltage VSS may be the voltages in which the circuit destruction does not occur.

The device under test DUT may provide the test response voltage VTR based on the test current IT and the selection voltage SV. The device under test DUT may include the test pad TP and the ground voltage pad GVP.

Referring to FIG. 7, the device under test DUT may include a first diode 231 and a second diode 233.

The first diode 231 may connect a cathode to a power supply voltage VDD and connect an anode to the test pad TP. In case the voltage greater than the power supply voltage VDD is applied to the test pad TP of the device under test DUT, the first diode 231 may be turned-on and a conduction path may be formed between the test pad TP and the power supply voltage VDD. Therefore a circuit inside the device may be protected in case the voltage greater than the power supply voltage VDD is applied to the circuit inside the device.

The test current IT may be provided to the device under test DUT through the cathode of the second diode 233.

The test current IT may be provided to test the connectivity of the second diode 233 of the device under test DUT. The direction of the test current IT is from the test unit 200 toward the device under test DUT. However, the test current IT may flow according to the direction from the device under test DUT toward the test unit 200.

In one embodiment, when the power supply voltage VDD is selected as the selection voltage SV, the power supply voltage VDD may be applied to the ground voltage pad GVP. Though the voltage drop may occur because of the second diode 233 placed between the ground voltage pad GVP and the test pad TP, the test response voltage VTR may be a positive voltage level. The test response voltage VTR may be the power supply voltage VDD minus the turn-on voltage VD of the diode 233.

In this case, the test response voltage VTR may be substantially equal to the voltage of the test pad TP and the first diode 231 may be turned-off because the voltage of the test pad TP is lower than the power supply voltage VDD. Therefore the connectivity of the second diode 233 may be tested when the test response voltage VTR is compared to the normal response voltage NRV.

For example, if the test response voltage VTR, which is measured by applying the test current IT to the test pad TP of the device under test DUT, is substantially equal to the normal response voltage NRV, the connectivity of the test pad TP inside the device under test DUT may be determined to be normal. If the test response voltage VTR is not equal to the normal response voltage NRV, the connectivity of the test pad TP inside the device under test DUT may be determined to be abnormal.

In example embodiments, the power supply voltage VDD may be higher than a turn-on voltage VD of the second diode 233 that is connected between the test pad TP and the ground voltage pad GVP.

If the power supply voltage VDD may be lower voltage than a turn-on voltage VD of the second diode 233, though the selection voltage switch 410 in the DC test mode selects the power supply voltage VDD as the selection voltage SV, the test response voltage VTR may be a negative voltage level. The test response voltage VTR may be the power supply voltage VDD minus the turn-on voltage VD of the diode. Therefore to prevent the circuit destruction of the interface chip 210, the power supply voltage VDD may be higher than the absolute value of the turn-on voltage VD of the second diode 233.

Using the test device 10 according to the example embodiments, the circuit destruction of the interface chip 210 may be prevented if the selection voltage SV is selected so that the test response voltage VTR in the DC test mode does not have the negative voltage level.

FIG. 8 is a diagram illustrating test results of the test system of FIG. 7 according to the connectivity of each diode included in the device under test and a test interface chip.

Referring to FIG. 8, the connectivity of the second diode 233 connected to the test pad TP is tested based on the test response voltage VTR in the DC test mode.

The test for the device under test DUT may be tested as following process.

The test response voltage VTR can be measured by applying the test current IT to the device under test DUT. If the test response voltage VTR is analyzed, the connectivity of the test pad TP inside the device under test DUT is tested.

For example, if a normal response voltage NRV at the test pad TP is known in case of applying the test current IT to the test pad TP in normal connectivity condition, the connectivity of the test pad TP may be tested using the normal response voltage NRV.

If the test response voltage VTR, which is measured by applying the test current IT to the test pad TP of the device under test DUT, is substantially equal to the normal response voltage NRV, the connectivity of the test pad TP may be determined to be normal. If the test response voltage VTR is not equal to the normal response voltage NRV, the connectivity of the test pad TP may be determined to be abnormal. For example, the normal response voltage NRV may be the power supply voltage VDD minus the turn-on voltage VD of the diode.

Referring to FIG. 8, in case the connectivity for the second diode 233 of the device under test DUT and the diode 212 of the test interface chip 210 is determined to be normal, the test response voltage VTR may be the normal response voltage NRV that is the power supply voltage VDD minus the turn-on voltage VD of the diode.

In case the connectivity for the second diode 233 of the device under test DUT is determined to be normal and the connectivity for the diode 212 of the test interface chip 210 is determined to be abnormal, the test response voltage VTR may be the normal response voltage NRV that is the power supply voltage VDD minus the turn-on voltage VD of the diode.

In case the connectivity for the second diode 233 of the device under test DUT is determined to be abnormal and the connectivity for the diode 212 of the test interface chip 210 is determined to be normal, the test response voltage VTR may be the negative turn-on voltage VD of the diode.

In case the connectivity for the second diode 233 of the device under test DUT is determined to be abnormal and the connectivity for the diode 212 of the test interface chip 210 is determined to be abnormal, the test response voltage VTR may be the negative infinite.

FIGS. 9, 10, 11 and 12 are circuit diagrams illustrating examples of the connectivity of each diode included in the device under test DUT and a test interface chip.

Figure 9:
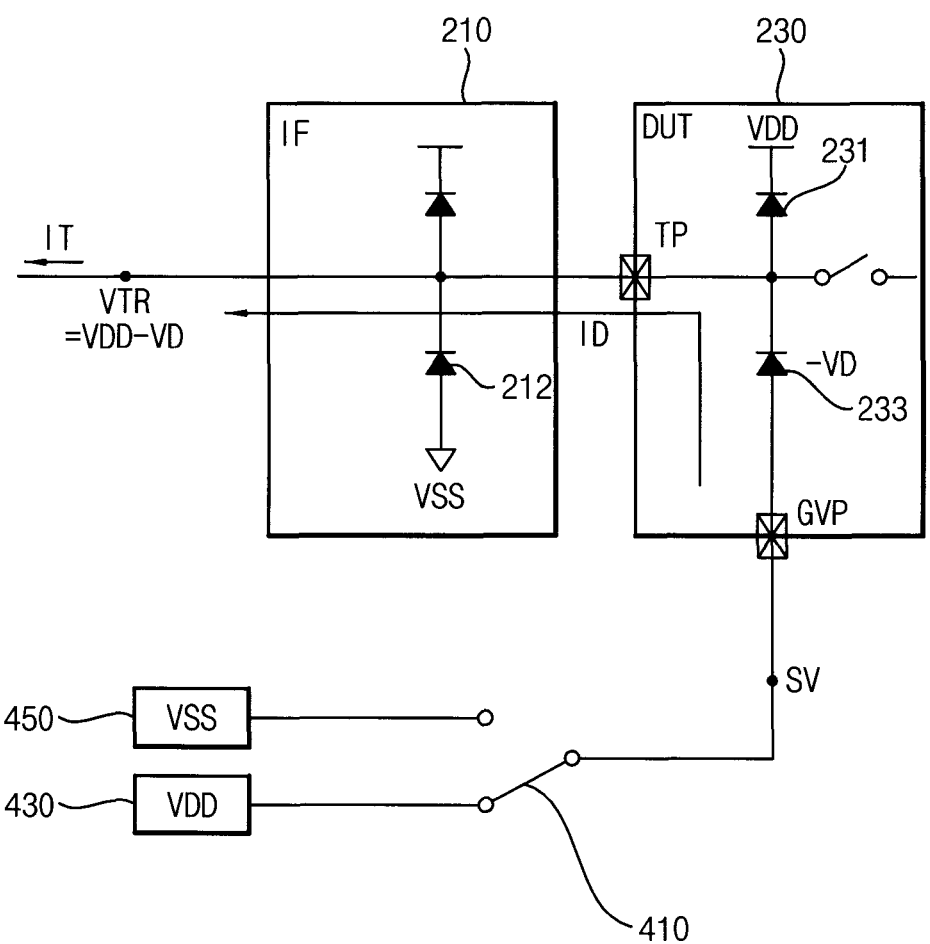
FIGS. 9, 10, 11 and 12 are circuit diagrams illustrating examples of the connectivity of each diode included in the device under test and a test interface chip.

Referring to FIG. 9, when the test response voltage VTR corresponds to the power supply voltage VDD minus the turn-on voltage VD of the diode, the connectivity of the second diode 233 of the device under test DUT may be determined to be normal.

The selection voltage switch 410 in the DC test mode may apply the power supply voltage VDD as the selection voltage SV to the ground voltage pad GVP. The control unit 100 may provide the test current IT with the test switch 211 in the DC test mode. The test switch 211 may apply the test current IT to the test pad TP bypassing the test current IT.

In case the connectivity for the second diode 233 of the device under test DUT and the diode 212 of the test interface chip 210 is determined to be normal, the test current IT may flow through the path connecting the power supply voltage VDD of the voltage selection circuit 400, the ground voltage pad GVP, the second diode 233 and the test pad TP. The test response voltage VTR may be the normal response voltage NRV that is the power supply voltage VDD minus the turn-on voltage VD of the diode.

In case the connectivity for the second diode 233 of the device under test DUT is determined to be normal, the diode 212 of the test interface chip 210 may be turned-off. The voltage in the test pad TP may be substantially equal to the test response voltage VTR. The test response voltage VTR may be the normal response voltage NRV.

The diode 212 of the test interface chip 210 may be turned-off because the cathode voltage of the test interface chip diode 212 is higher than the ground voltage VSS. Therefore the current may not flow through the diode 212 of the test interface chip 210.

Figure 10:
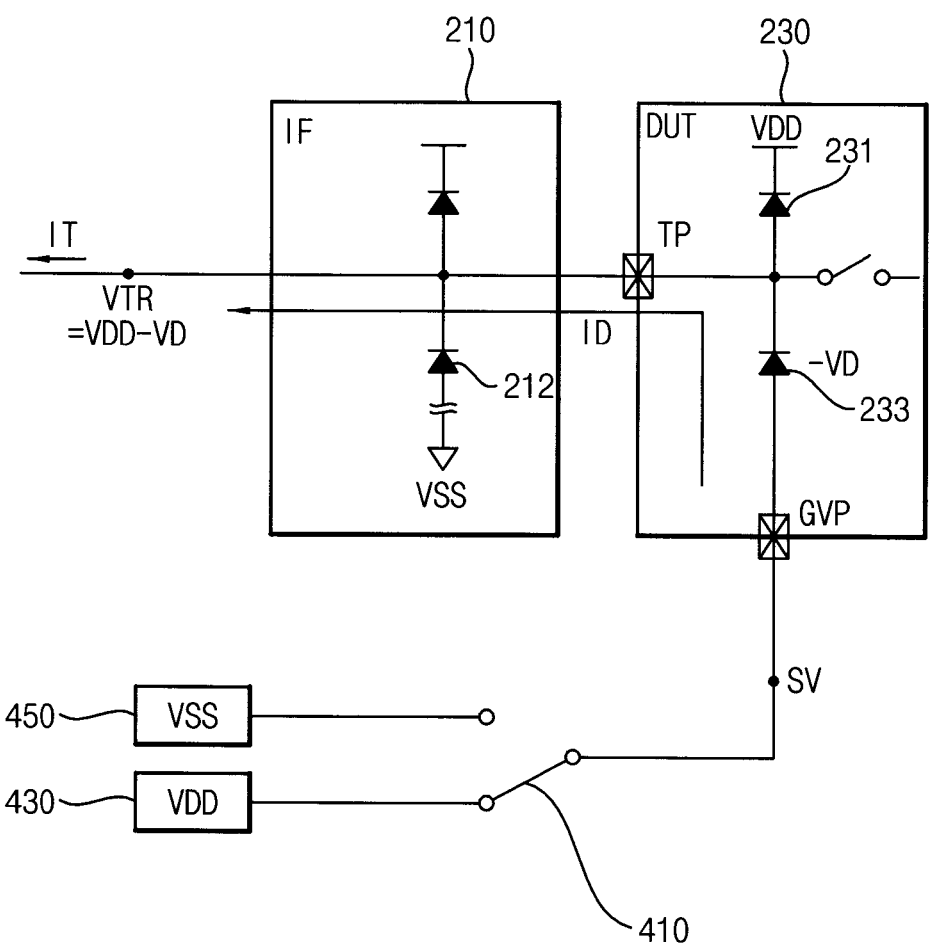

Referring to FIG. 10, in case the connectivity for the second diode 233 of the device under test DUT is determined to be normal and the connectivity for the diode 212 of the test interface chip 210 is determined to be abnormal, the test current IT may flow through the path connecting the power supply voltage VDD of the voltage selection circuit 400, the ground voltage pad GVP, the second diode 233 and the test pad TP. The test response voltage VTR may be the normal response voltage NRV that is the power supply voltage VDD minus the turn-on voltage VD of the diode.

Though the connectivity of the diode 212 in the test interface chip 210 is determined to be abnormal, the abnormal connectivity of the diode 212 in the test interface chip 210 may not have an effect on the test for the connectivity of the test pad TP of the device under test DUT because the current does not flow through the diode 212 in the test interface chip 210 in case of the normal connectivity of the second diode 233.

Figure 11:
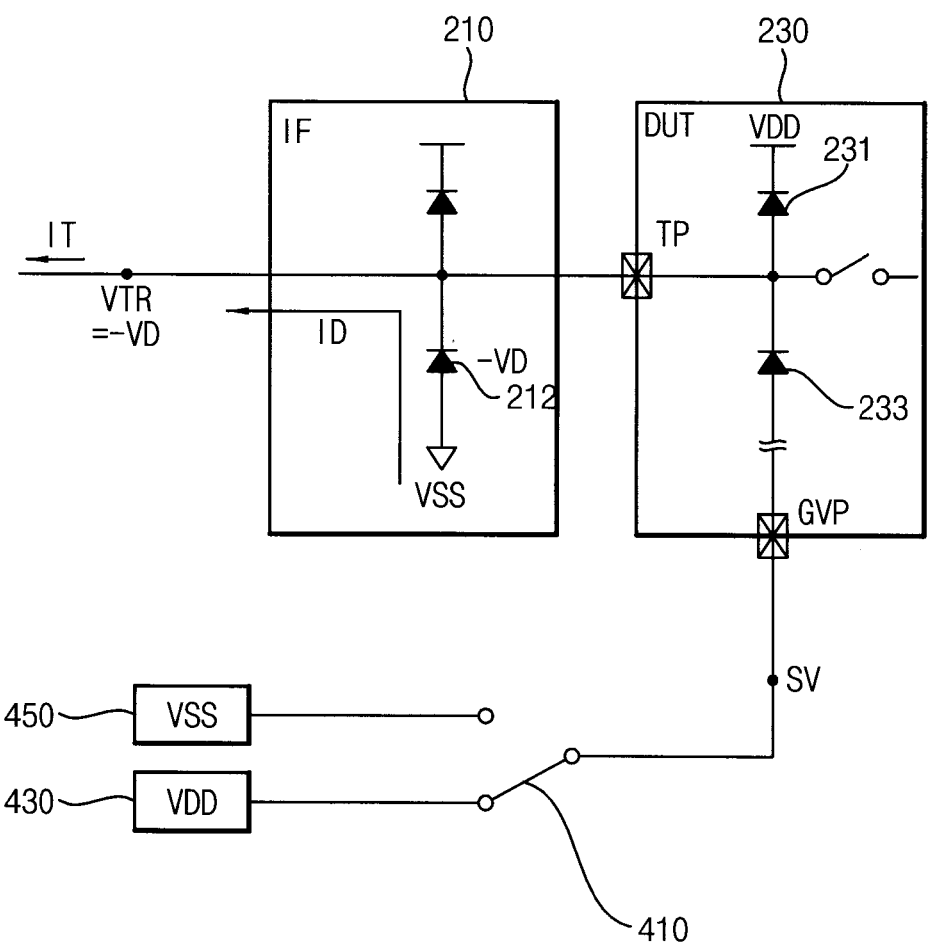

Referring to FIG. 11, when the absolute value of the test response voltage VTR corresponds to the turn-on voltage VD of the second diode 233, the connectivity of the second diode 233 may be determined to be abnormal.

In case the connectivity for the second diode 233 of the device under test DUT is determined to be abnormal and the connectivity for the diode 212 of the test interface chip 210 is determined to be normal, the test current IT may flow through the path connecting the ground voltage VSS in the test interface chip 210 and the diode 212 in the test interface chip 210. The test response voltage VTR may be the negative turn-on voltage VD of the diode in the test interface chip 210.

In case the connectivity for the second diode 233 of the device under test DUT is determined to be abnormal, the diode 212 of the test interface chip 210 may be turned-on. The voltage in the test pad TP may be substantially equal to the test response voltage VTR. The test response voltage VTR may be the negative turn-on voltage VD of the diode 212 in the test interface chip 210.

The diode 212 in the test interface chip 210 may be turned-on because the cathode voltage of the diode 212 is lower than the ground voltage VSS. Therefore the current may flow through the diode 212 in the test interface chip 210.

In case of the abnormal connectivity of the second diode 233, the path through the device under test DUT may not be formed. The voltage in the test pad TP may be the negative turn-on voltage VD of the diode 212 in the test interface chip 210.

Figure 12:
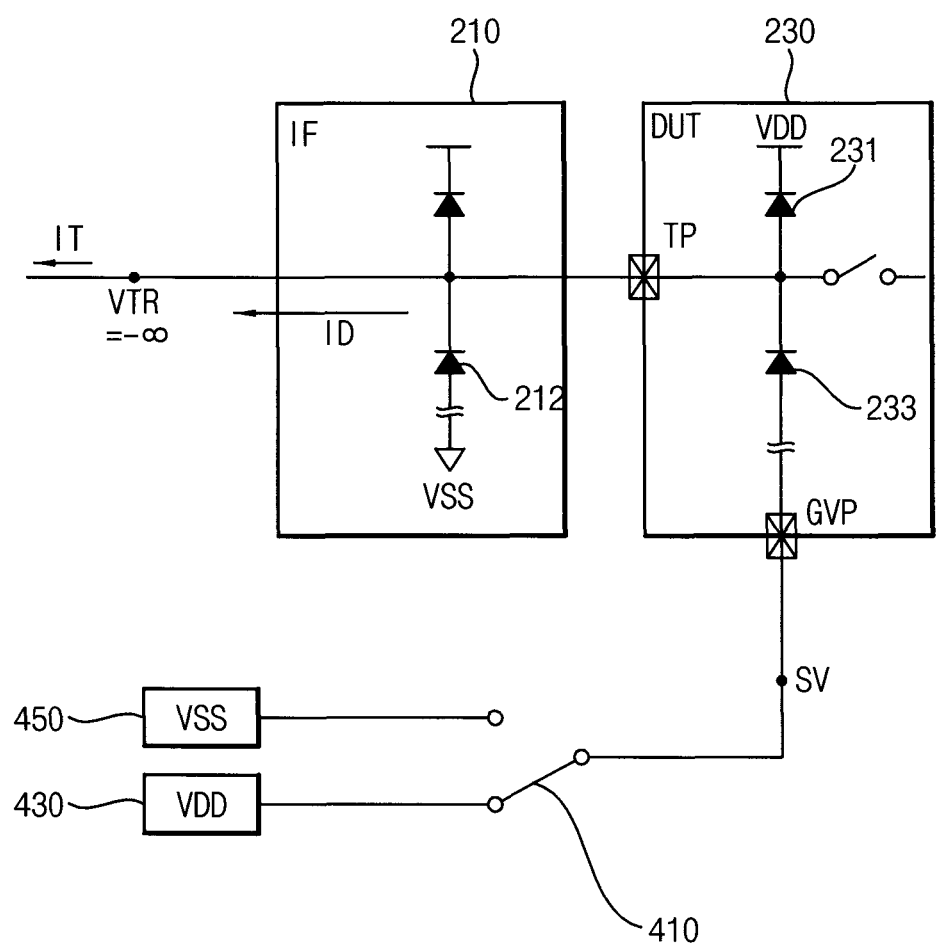

Referring to FIG. 12, when the test response voltage VTR is negatively infinite, the connectivity for the second diode 233 of the device under test DUT may be determined to be abnormal and the connectivity for the diode 212 of the test interface chip 210 may be determined to be abnormal.

In case the connectivity for the second diode 233 of the device under test DUT is determined to be abnormal and the connectivity for the diode 212 of the test interface chip 210 is determined to be abnormal, the path through that the current flows to the test interface chip 210 and the device under test DUT may not be formed. Therefore the test response voltage VTR is negative infinite because the direction of the test current IT is from the device under test DUT toward the control unit 100 and the register value is infinite.

Using the test device 10 according to the example embodiments, the circuit destruction of the interface chip 210 may be prevented if the selection voltage SV is selected so that the test response voltage VTR in the DC test mode does not have the negative voltage level.

Figure 13:
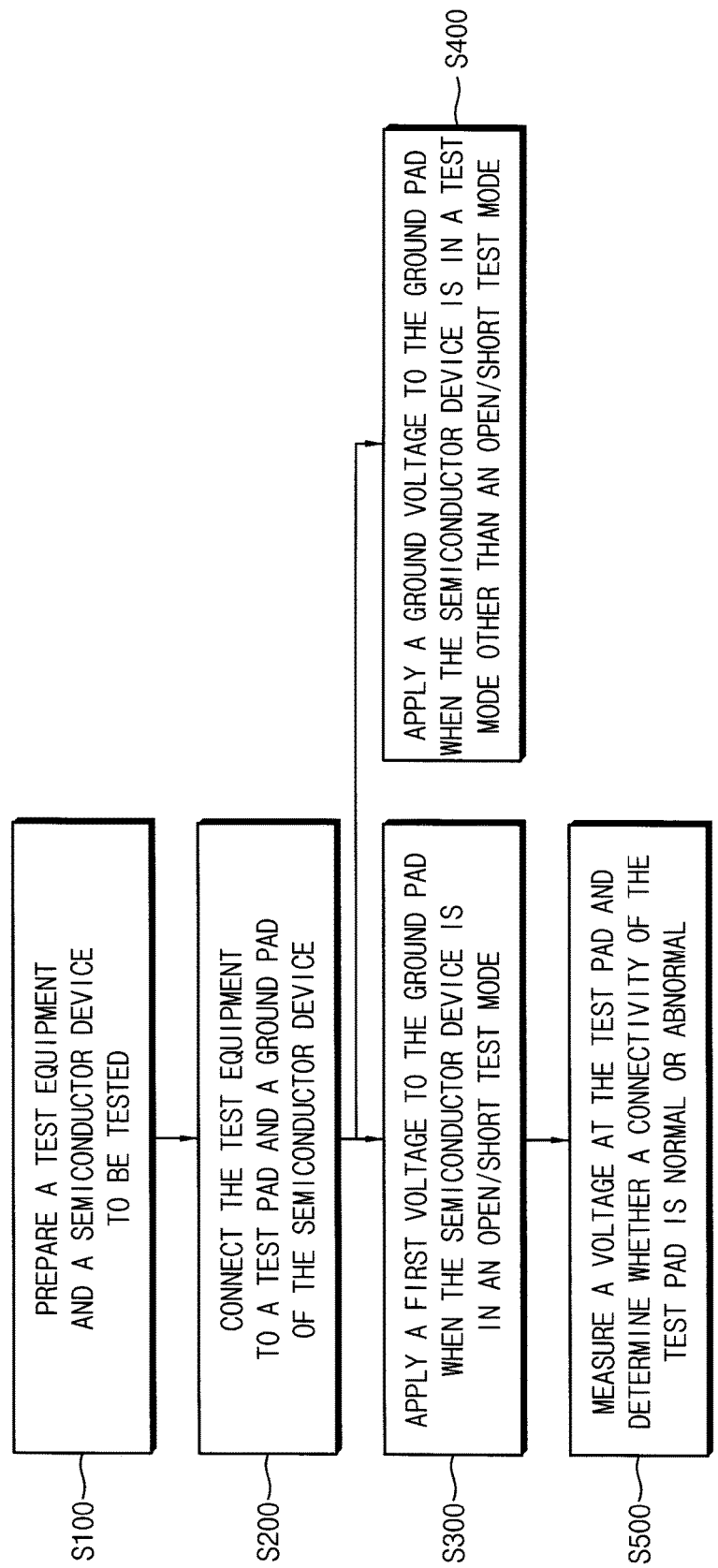
FIG. 13 is a flow chart illustrating a method of testing a semiconductor device according to example embodiments.

FIG. 13 is a flow chart illustrating a method of testing a semiconductor device according to example embodiments.

Referring to FIG. 13, a method of testing a semiconductor device to be tested is provided. The method includes preparing a test equipment and the semiconductor device under test (S100); connecting the test equipment to a test pad and a ground pad of the semiconductor device (S200); applying a first voltage to the ground pad when the semiconductor device is in an open/short test mode, the first voltage having a voltage level greater than a ground level (S300); applying a ground voltage to the ground pad when the semiconductor device is in a test mode other than the open/short test mode (S400); and measuring a voltage at the test pad and determining whether a connectivity of the test pad is normal or abnormal (S500).

Figure 14:
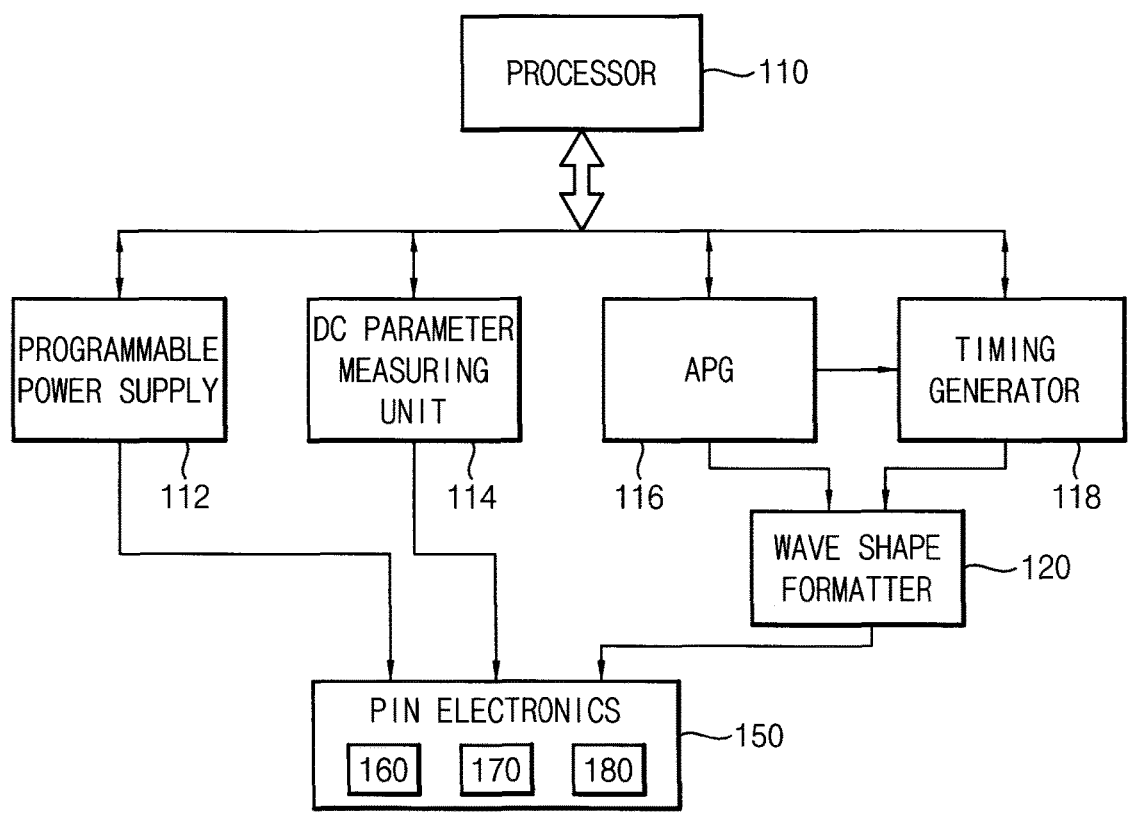
FIG. 14 is a block diagram illustrating an example of a control unit included in the test unit of FIG. 2.

FIG. 14 is a block diagram illustrating an example of the control unit included in the test unit of FIG. 2.

Referring to FIG. 14, the ATE 100 includes a processor 110 for controlling hardware components of the ATE 100. In some example embodiments, the hardware components include a programmable power supply 112, a DC parameter measurement unit 114, an algorithmic pattern generator 116, a timing generator 118, a wave shape formatter 120, a pin electronics 150, and the like. The pin electronics 150 includes the driver channels 160, the I/O channels 170 and the power channels 180. In the ATE 100, a test program running on the processor 110 communicates signals and electrically tests functions of the DUT connected via the pin electronics 150 by using the test interface chip 210.

The test program for testing the DUT typically includes a DC test, an AC test, and a function test. For example, the DUT includes one of a semiconductor chip, a semiconductor package, etc. The function test commonly operates to check the functionality of the DUT, for example, a DRAM, under its actual operational condition. That is, in some test program configurations an input pattern from the algorithmic pattern generator 116 of the ATE is written to the DUT, for example, the DRAM (write operation), and a returned output pattern from the DRAM is read out (read operation) and compared at the ATE 100 to an expected return pattern by a comparator (compare operation).

Figure 15:
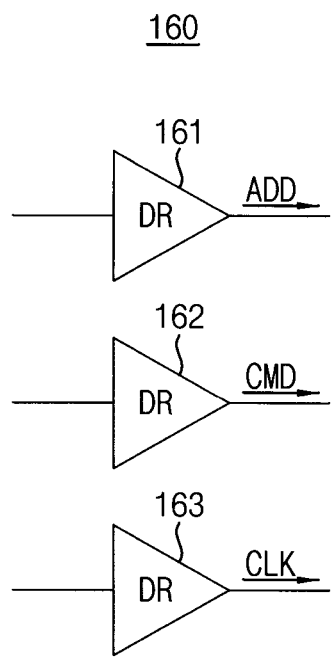
FIG. 15 is a diagram illustrating an example of a driver channel included in the control unit of FIG. 14.

FIG. 15 is a diagram illustrating an example of a driver channel included in the control unit of FIG. 14.

Referring to FIG. 15, the driver channels 160 may include a plurality of drivers 161, 162 and 163. The driver 161 provides the address signal ADD, the driver 162 provides the command signal CMD and the driver 163 provides the clock signal CLK. In this example embodiment, the driver channels 160 are uni-directional channels for providing the address signal ADD, the command signal CMD and the clock signal CLK to the corresponding pins of the DUT. Other control signals for controlling the functionality of the DUT can likewise be generated by the ATE 100 and output to the DUT via the driver channels 160.

Using the test system according to the example embodiments, the circuit destruction of the interface chip may be prevented if the selection voltage SV is selected so that the test response voltage VTR in the DC test mode does not have the negative voltage level.

Figure 16:
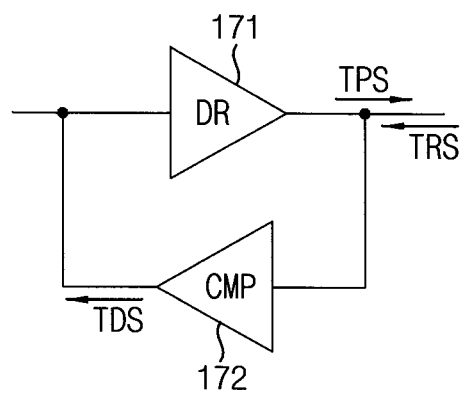
FIG. 16 is a diagram illustrating an example of an I/O channel included in the control unit of FIG. 14.

FIG. 16 is a diagram illustrating an example of an I/O channel included in the control unit of FIG. 14.

Referring to FIG. 16, the I/O channels 170 may include a driver 171 and a comparator 172. The driver 171 provides the data I/O pins of the DUT through the test interface chip 210 with a test pattern signal TPS provided from the algorithmic pattern generator 116 and the wave shape formatter 120. The comparator 172 receives the test result signal TRS from the DUT, compares the test result signal TRS with the test pattern signal TPS and outputs test determining signal TDS having a logic level according to a result of the comparison. For example, the comparator 172 may output the test determining signal TDS having a first logic level (i.e., logic high level) when the test result signal TRS matches with the expected test pattern signal TPS. For example, the comparator 172 may output the test determining signal TDS having a second logic level (i.e., logic low level) when the test result signal TRS does not match with the expected test pattern signal TPS. Therefore, the ATE 100 may determine whether the DUT passes or fails based on the test determining signal TDS.

In some example embodiments, according to alternative embodiments, the I/O channels 170 may be bi-directional channels for providing the test pattern signal TPS to the DUT and receiving the returned test result signal TRS. In this example, the returned test result signal TRS is buffered by a return buffer or driver 172 and transmitted to the ATE 100 for signal comparison or analysis.

In some example embodiments, the comparator 172 may be included in the test interface chip 210. When the comparator 172 is included in the test interface chip 210, the comparator 172 may be implemented with an additional driver that outputs the test determining signal TDS to the ATE 100.

Figure 17:
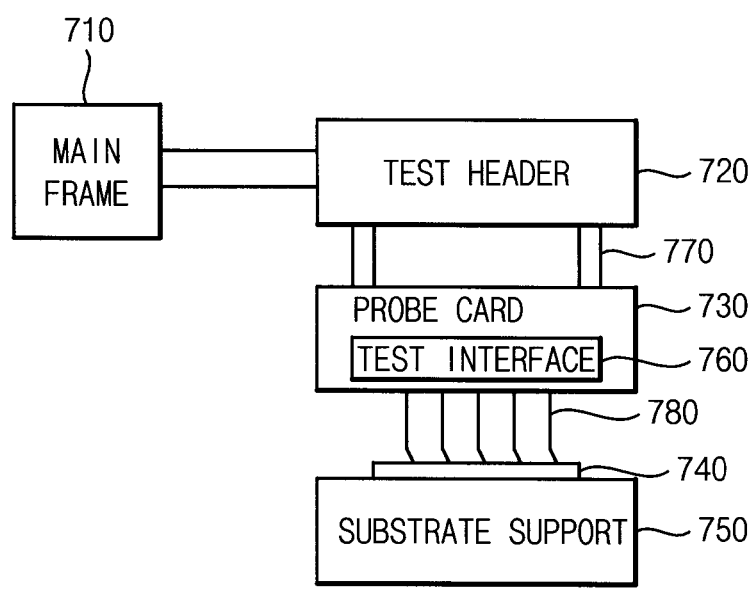
FIG. 17 is a block diagram illustrating a test system according to other example embodiments.

FIG. 17 is a block diagram illustrating a test system according to other example embodiments.

Referring to FIG. 17, a test system 700 includes a test main frame 710, a test header 720, a probe card 730, a wafer 740, and a substrate support 750. The wafer 740 may include a plurality of semiconductor devices that are to be tested.

The test main frame 710 may generate a test signal, and may receive test result signals generated by the semiconductor devices formed in the wafer 740. In some embodiments, the test header 720 may move up and down such that the probe card 730 may be easily attached to the test header 720 and the wafer 740 may be easily mounted on the substrate support 750. In other embodiments, the substrate support 750 may move up and down while the test header 720 is fixed. In still other embodiments, both of the test header 720 and the substrate support 750 may move up and down. The test main frame 710, the test header 720 and the substrate support 750 may constitute an ATE.

The probe card 730 may include a test interface board 760, a connector 770 and probe needles 780. The connector 770 may connect the test header 720 to the test interface board 760, and the probe needles 780 may connect the test interface board 760 to pads of the semiconductor devices. The test interface board 760 transmits the test operating signals from the connector 770 to the probe needle 780 through reconfigurable test signal paths. In addition, the test interface board 760 transmits the test result signal from the probe needle 780 to the connector 770 through the reconfigurable test signal paths. In this manner, the overall test cost of the test system 700 may be reduced because the test interface board 760 need not be changed even in case where the attributes of the pads of the wafer 740 are changed. This is because, in accordance with the present inventive concepts, the test interface board 760 can be reconfigured so that the various channels of the ATE can be connected to the various probe needles of the probe card in different ways. Therefore, different types of devices present on the wafer 740 can be tested without the need for changing the test interface board 760.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims.

What is claimed is:

1. A test device comprising:
    a test unit configured to detect a voltage at a test pad of a semiconductor device under test by applying a test current to the test pad; and
    a voltage selection circuit configured to apply a selection voltage to a ground pad of the semiconductor device under test, the selection voltage being selected among a plurality of voltages according to a test mode,
    wherein the voltage selection circuit is further configured to select a first voltage having a first voltage level greater than a ground voltage as the selection voltage in an open/short test mode and select the ground voltage as the selection voltage in a test mode other than the open/short test mode.

2. The test device of claim 1, wherein when the selection voltage is the first voltage and a connectivity of the test pad is normal, the detected voltage at the test pad has a second voltage level less than the first voltage level.

3. The test device of claim 1, wherein the test unit includes:
    a control unit configured to provide the test current in the open/short test mode; and
    a test interface chip configured to apply the test current to the test pad bypassing the test current through a test switch that is turned on in the open/short test mode.

4. The test device of claim 3, wherein the voltage selection circuit includes:
    a selection voltage switch configured to select either the ground voltage or the first voltage in response to a control signal that is activated in the open/short test mode.

5. The test device of claim 4, wherein the voltage selection circuit is located inside the test interface chip, and
    wherein the selection voltage switch receives the control signal from a controller included in the test interface chip.

6. The test device of claim 4, wherein the voltage selection circuit is located outside the test interface chip, and
    wherein the selection voltage switch receives the control signal from the control unit.

7. The test device of claim 3, wherein the voltage selection circuit is located outside the test interface chip, and
    wherein the voltage selection circuit receives the first voltage from the control unit.

8. A test system comprising:
    a semiconductor device under test including a test pad and a ground voltage pad, the semiconductor device under test being connected to provide a test response voltage at the test pad based on a test current and a selection voltage;
    a test unit including a current source, the test unit connected to detect the test response voltage at the test pad of the semiconductor device by applying the test current from the current source to the test pad; and
    a voltage selection circuit connected to apply the selection voltage to the ground voltage pad of the semiconductor device, the selection voltage being selected among a plurality of voltages according to a test mode.

9. The test system of claim 8, wherein the semiconductor device includes:
    a first diode including a cathode connected to a power supply voltage and an anode connected to the test pad; and
    a second diode including a cathode connected to the test pad and an anode connected to the ground voltage pad,
    wherein in an open/short test mode, the test current is additionally provided to the test pad through the second diode.

10. The test system of claim 9, wherein the power supply voltage is higher than a turn-on voltage of the second diode.

11. The test system of claim 10, wherein the semiconductor device is configured such that a connectivity of the second diode is tested based on the test response voltage in the open/short test mode.

12. The test system of claim 11, wherein the semiconductor device is configured such that the second diode is determined to be connected when the test response voltage corresponds to the difference value between the power supply voltage and the turn-on voltage of the second diode.

13. The test system of claim 11, wherein the semiconductor device is configured such that the second diode is determined to be not connected when the absolute value of the test response voltage corresponds to the turn-on voltage of the second diode.

14. The test system of claim 11, wherein the semiconductor device is configured such that the connectivity of the second diode and a connectivity of a diode of an interface chip of the test unit are determined to be not connected when the test response voltage is negatively infinite, the interface chip being connected to the test pad.

15. A method of testing a semiconductor device, the method comprising:
    preparing a test equipment and the semiconductor device to be tested;
    connecting the test equipment to a test pad and a ground pad of the semiconductor device;
    applying a first voltage to the ground pad when the semiconductor device is in an open/short test mode, the first voltage having a voltage level greater than a ground level; and
    measuring a voltage at the test pad and determining whether a connectivity of the test pad is normal or abnormal.

16. The method of claim 15, further comprising:
    applying a first test current to the test pad,
    wherein applying the first voltage to the ground pad includes applying a second test current to the test pad through a diode connected between the test pad and the ground pad.

17. The method of claim 16, wherein a level of the first voltage is greater than a turn-on voltage of the diode.

18. The method of claim 16, wherein a voltage level of the test pad is VDD-VD when a connectivity of the test pad is normal, the first voltage being VDD and the turn-on voltage of the diode being VD.

19. The method of claim 15, further comprising:
    applying a ground voltage to the ground pad when the semiconductor device is in a test mode other than the open/short test mode.

* * * * *